(12) United States Patent
Kuo et al.

(10) Patent No.: US 10,224,357 B1
(45) Date of Patent: Mar. 5, 2019

(54) IMAGE SENSOR PACKAGES

(71) Applicant: VisEra Technologies Company Limited, Hsin-Chu (TW)

(72) Inventors: Wu-Cheng Kuo, Hsin-Chu (TW);
Kuo-Feng Lin, Kaohsiung (TW);
Tsung-Lin Wu, Taichung (TW);
Yu-Jen Chen, Taoyuan (TW);
Chin-Chuan Hsieh, Hsin-Chu (TW);
Kuang-Peng Lin, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/697,825

(22) Filed: Sep. 7, 2017

(51) Int. Cl.
*H01L 27/00* (2006.01)
*H01L 27/146* (2006.01)
*H01L 31/0232* (2014.01)

(52) U.S. Cl.
CPC .. *H01L 27/14625* (2013.01); *H01L 27/14621* (2013.01); *H01L 27/14649* (2013.01); *H01L 31/02327* (2013.01)

(58) Field of Classification Search
CPC ................................................ H01L 27/14625
See application file for complete search history.

(56) References Cited

U.S. PATENT DOCUMENTS

2014/0027612 A1* 1/2014 Oganesian ........ H01L 27/14625
250/208.1
2014/0268332 A1 9/2014 Guo et al.

FOREIGN PATENT DOCUMENTS

| JP | 2013-157605 | 8/2013 |
|---|---|---|
| JP | 2014-515839 | 7/2014 |
| JP | 2015-22279 | 2/2015 |
| JP | 2015-37155 | 2/2015 |
| JP | 2015-185844 | 10/2015 |
| JP | 2016-76682 | 5/2016 |
| JP | 2016-219767 | 12/2016 |
| WO | WO-2015/056584 | 4/2015 |
| WO | WO2017064845 A1 | 4/2017 |

OTHER PUBLICATIONS

Office Action for the corresponding Tiawanese Application dated Oct. 8, 2018. 5 pages.
JPO. Office Action to Corresponding JP application No. 2017-241451 dated Nov. 27, 2018. 5 pages.

* cited by examiner

*Primary Examiner* — William Harriston
(74) *Attorney, Agent, or Firm* — Muncy, Geissler, Olds & Lowe, P.C.

(57) ABSTRACT

An image sensor package includes a medium layer having a first surface and a second surface opposite to the first surface. The image sensor package also includes a metal-insulator-metal structure disposed on the first surface of the medium layer. The metal-insulator-metal structure includes a first metal layer, a first insulating layer, and a second metal layer, and the first insulating layer is disposed between the first metal layer and the second metal layer. The image sensor package further includes an optical filter disposed on the second surface of the medium layer.

20 Claims, 11 Drawing Sheets

IMAGE SENSOR PACKAGES

BACKGROUND

Field of the Disclosure

This invention relates to image sensor technology, and more particularly to image sensor packages with an optical filter and a metal-insulator-metal structure.

Description of the Related Art

To capture a color image of a scene, an image sensor must be sensitive to a broad spectrum of light. The image sensor reacts to light that is reflected from the scene and can convert the strength of that light into electronic signals. An image sensor, such as a charge-coupled device (CCD) image sensor or a complementary metal-oxide semiconductor (CMOS) image sensor, generally has photoelectric conversion regions that convert incident light into electronic signals. In addition, the image sensor has logic circuits for transmitting and processing the electronic signals.

Nowadays, image sensors are widely applied in many fields, as well as in devices such as light sensors, proximity sensors, time-of-flight (TOF) cameras, spectrometers, smart sensors used in the Internet of things (IOT), and sensors for advanced driver assistance systems (ADAS), for example.

Although existing image sensor packages have been adequate for their intended purposes, they have not been entirely satisfactory in all respects. Therefore, there are still some problems with image sensor packages that remain to be overcome.

BRIEF SUMMARY

According to embodiments of the disclosure, image sensor packages have an optical filter and a metal-insulator-metal structure disposed above photoelectric conversion regions. The optical filter can absorb the light that is not expected to be transmitted to the photoelectric conversion regions of the image sensor packages, increasing the signal-to-noise (S/N) ratio. In addition, the metal-insulator-metal (MIM) structure can narrow the full width at half maximum (FWHM) of the light transmitted to the photoelectric conversion regions. As a result, the image sensor package can produce a high signal-to-noise (S/N) ratio. Moreover, the MIM structure can help the image sensor package to reduce the blue shift, and decrease the decay of the angular response at large angles of incidence. Furthermore, the MIM structure is thin enough to reduce the overall size of the image sensor package.

In some embodiments, an image sensor package is provided. The image sensor package includes a medium layer having a first surface and a second surface opposite to the first surface. The image sensor package also includes a metal-insulator-metal structure disposed on the first surface of the medium layer, wherein the metal-insulator-metal structure includes a first metal layer, a first insulating layer, and a second metal layer, and wherein the first insulating layer is disposed between the first metal layer and the second metal layer. The image sensor package further includes an optical filter disposed on the second surface of the medium layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 4B shows the electric field distribution of the MIM structure when the angle of incidence is 0 degrees. FIG. 4C shows the electric field distribution of the MIM structure when the angle of incidence is 30 degrees;

FIG. 6A shows the electric field distribution of the image sensor package when the wavelength of the incident light is 670 nm. FIG. 6B shows the electric field distribution of the image sensor package when the wavelength of the incident light is 940 nm.

DETAILED DESCRIPTION OF THE INVENTION

The following description is of the contemplated mode of carrying out the disclosure. This description is made for the purpose of illustrating the general principles of the disclosure and should not be taken in a limiting sense. The scope of the disclosure is best determined by reference to the appended claims.

Figures 1A, 1B:
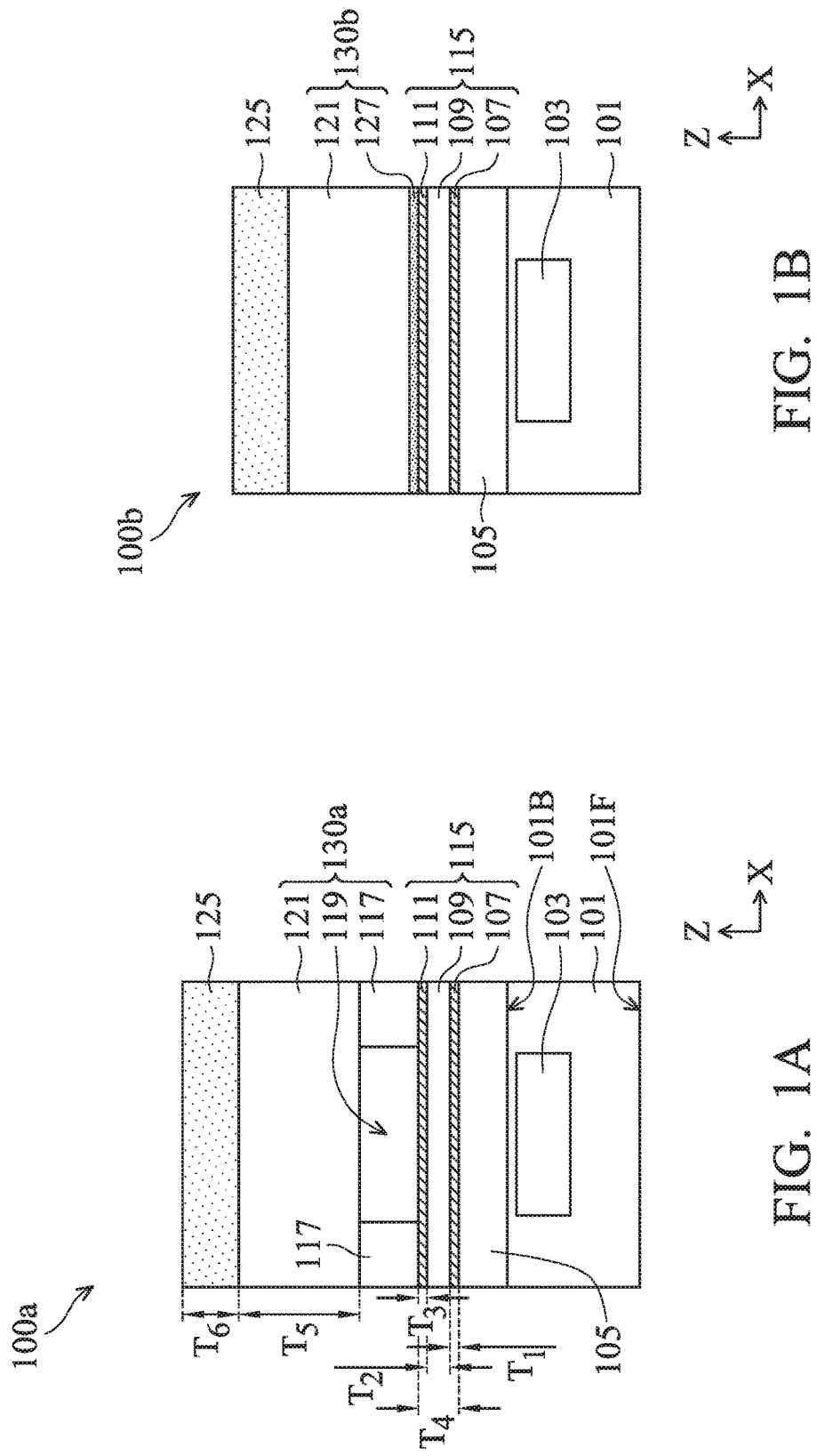
FIG. 1A shows a partial cross section of an image sensor package according to some embodiments.
FIG. 1B shows a partial cross section of an image sensor package according to some embodiments.

Referring to FIG. 1A, a partial cross section of an image sensor package 100a according to some embodiments is shown. In some embodiments, the image sensor package 100a is a complementary metal-oxide semiconductor (CMOS) image sensor (CIS) package. The image sensor package 100a includes a semiconductor substrate 101, for example a silicon wafer or a chip. The semiconductor substrate 101 has a plurality of photoelectric conversion regions 103, and each of the photoelectric conversion regions 103 may include a photoelectric conversion element, such as a photodiode. Although FIG. 1A shows only one photoelectric conversion region 103, actually the image sensor package 100a can have multiple photoelectric conversion regions 103 arranged in an array.

The back surface 101B of the semiconductor substrate 101 usually has photoelectric conversion regions 103 formed thereon. The front surface 101F of the semiconductor substrate 101 usually has a wiring layer (not shown) of various wiring lines and electronic circuits required for the image sensor package 100a formed thereon. In some embodiments, the image sensor package 100a is a backside illumination (BSI) image sensor package. In the BSI image sensor package, the back surface 101B of the semiconductor substrate 101 having the photoelectric conversion regions 103 formed thereon is close to the light receiving surface of the image sensor package 100a. The front surface 101F of the semiconductor substrate 101 having the wiring layer formed thereon is far from the light receiving surface of the image sensor package 100a.

In some other embodiments, the semiconductor substrate 101 of the image sensor package 100a is inverted to be a front-side illumination (FSI) image sensor package. In the FSI image sensor package, the front surface 101F of the semiconductor substrate 101 having the wiring layer formed thereon is close to the light receiving surface of the image sensor package 100a. The back surface 101B of the semiconductor substrate 101 having the photoelectric conversion regions 103 formed thereon is far from the light receiving surface of the image sensor package 100a. In the present embodiment as shown in FIG. 1A, the image sensor package 100a is a BSI image sensor package.

As shown in FIG. 1A, in accordance with some embodiments, the image sensor package 100a further includes a high dielectric-constant (high-k) film 105 formed on the semiconductor substrate 101 and covering the photoelectric conversion region 103. The high-k film 105 can be made of hafnium oxide ($HfO_2$), hafnium tantalum oxide (HfTaO), hafnium titanium oxide (HfTiO), hafnium zirconium oxide (HfZrO), tantalum pentoxide ($Ta_2O_5$) or another suitable high-k dielectric material and may be formed by a deposition process. The high-k film 105 has a high-refractive index, for example, from 2.0 to 2.5.

In some embodiments, the image sensor package 100a includes a metal-insulating-metal (MIM) structure 115 formed on the high-k film 105. The MIM structure 115 includes a first metal layer 107, a first insulating layer 109, and a second metal layer 111. The first insulating layer 109 is sandwiched between the first metal layer 107 and the second metal layer 111. Although FIG. 1A shows three layers in the MIM structure 115, there can be more than three layers in the MIM structure 115. For example, the MIM structure 115 may be a five-layered structure, which further includes a second insulating layer (not shown) and a third insulating layer (not shown), and the first metal layer 107, the first insulating layer 109, and the second metal layer 111 are sandwiched between the second insulating layer and the third insulating layer. In the MIM structure, the metal layers and the insulating layer are arranged alternately.

In some embodiments, the first metal layer 107 and the second metal layer 111 may be made of silver (Ag), and the first insulating layer 109, the second insulating layer (not shown) and the third insulating layer (not shown) are made of amorphous silicon. The first metal layer 107 has a thickness T1, the first insulating layer 109 has a thickness T2, and the second metal layer 111 has a thickness T3. Both the thickness T1 and the thickness T3 are less than the thickness T2. As shown in FIG. 1A, the sum of the thicknesses T1, T2 and T3 is defined as the total thickness T4 of the MIM structure 115.

In another embodiment, a five-layered MIM structure is provided. In this embodiment, the five-layered MIM structure further includes the second and third insulating layers, the first metal layer 107 and the second metal layer 111 are made of silver, and the first insulating layer 109, the second insulating layer, and the third insulating layer are made of amorphous silicon. The thickness T1 is 20 nm, the thickness T2 is 352.8 nm, and the thickness T3 is 24 nm, and the second and third insulating layers have thicknesses of 77 nm and 96.8 nm, respectively. As a result, the total thickness of the five-layered MIM structure is about 571 nm, which is very thin.

Still referring to FIG. 1A, a spacer layer (or dam) 117 is disposed on the MIM structure 115, and a cavity 119 is surrounded by the spacer layer 117. Moreover, at least a portion of the photoelectric conversion region 103 is not covered by the spacer layer 117, and the cavity 119 is disposed directly above the portion of the photoelectric conversion region 103. In some embodiments, a cover plate 121 is disposed on the spacer layer 117 and the cavity 119, and the cover plate 121 can be a transparent material. Specifically, the cover plate 121 may be made of glass, a transparent plastic material, or another suitable material. To sum up, the cavity 119 is enclosed by the MIM structure 115, the spacer layer 117 and the cover plate 121. The spacer layer 117, the cavity 119 and the cover plate 121 compose a medium layer 130a.

In some embodiments, the spacer layer 117 may be made of inorganic materials, for example, silicon oxide, silicon nitride, silicon oxynitride, metal oxide or a combination thereof, organic polymer materials, for example, epoxy resin, polyimide, butylcyclobutene (BCB), parylene, polynaphthalenes, fluorocarbons or acrylates, a photoresist material or another suitable insulating material. The cover plate 121 may be any suitable material, including, but not limited to, glass, plastic, acrylic, sapphire, and a combination thereof. In some embodiments, the cover plate 121 has a thickness T5, which is in a range from about 200 μm to about 500 μm. In addition, the refractive index of the cover plate 121 is about 1.55.

As shown in FIG. 1A, the image sensor package 100a further includes an optical filter 125 disposed on the cover plate 121. In some embodiments, the optical filter 125 may be a blue-light-transmissive filter, a green-light-transmissive filter, a red-light-transmissive filter, or an infrared-transmissive filter. In some embodiments, the optical filter 125 is made of a photoresist material and a pigment mixed in the photoresist material, and the photoresist material may be an organic material. Moreover, the optical filter 125 has a thickness T6 which is in a range from about 1 μm to 20 μm, especially in a range from about 10 μm to about 20 μm.

In some embodiments, the thickness T5 of the cover plate 121 is greater than the thickness T6 of the optical filter 125, and the thickness T6 of the optical filter 125 is greater than the total thickness T4 of the MIM structure 115.

The image sensor package 100a in FIG. 1A includes the optical filter 125 and the MIM structure 115 disposed above the photoelectric conversion region 103, and the optical filter 125 and the MIM structure 115 are disposed on two opposite sides of the medium layer 130a. Specifically, the MIM structure 115 is disposed between the photo electric conversion region 103 and the medium layer 130a.

The optical filter 125 can absorb the light that is not expected to be transmitted to the photoelectric conversion region 103, thereby the signal-to-noise (S/N) ratio can be increased. In other words, the transmission rate (also called transmittance) of the undesired light can be decreased by the optical filter 125. Moreover, the MIM structure 115 can narrow the full width at half maximum (FWHM) of the light transmitted to the photoelectric conversion region 103. As a result, the image sensor package 100*a* can produce a high signal-to-noise (S/N) ratio. Furthermore, the MIM structure 115 can help the image sensor package 100*a* to reduce the blue shift, and decrease the decay of the angular response at large angles of incidence. In addition, the size of the image sensor package 100*a* will not be increased too much since the MIM structure 115 is thin enough.

Referring to FIG. 1B, a partial cross section of an image sensor package 100*b* according to some embodiments is shown. In the embodiment of FIG. 1B, the spacer layer 117 and the cavity 119 of FIG. 1A are replaced by an adhesive layer 127, such as a transparent glue, and the adhesive layer 127 and the cover plate 121 compose a medium layer 130*b*. In addition, the positions of the MIM structure 115 and the optical filter 125 in the embodiment of FIG. 1B are not changed from the embodiment of FIG. 1A. In some embodiments, the MIM structure 115 is attached to the cover plate 121 by the adhesive layer 127. Some components of the image sensor package 100*b* are similar to those of the image sensor package 100*a* shown in FIG. 1A and are not repeated herein for simplicity.

Figure 1D:
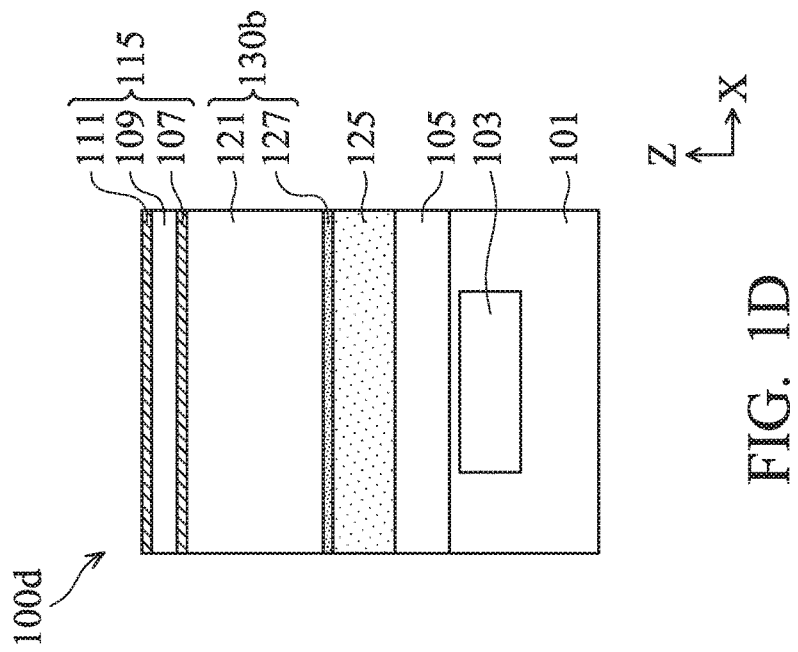
FIG. 1D shows a partial cross section of an image sensor package according to some embodiments.
Figure 1C:
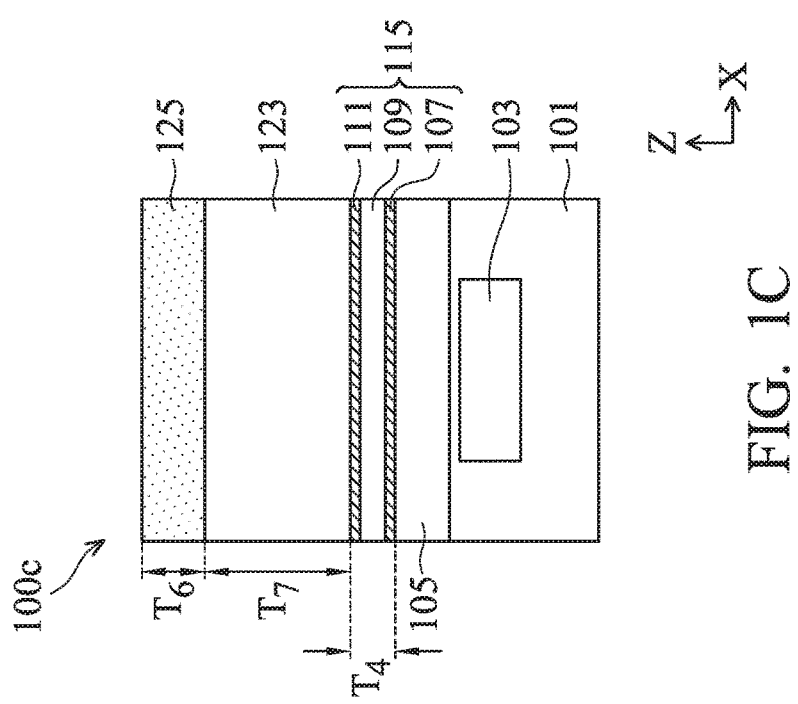
FIG. 1C shows a partial cross section of an image sensor package according to some embodiments.

Referring to FIG. 1C, a partial cross section of an image sensor package 100*c* according to some embodiments is shown. In the embodiment of FIG. 1C, the cover plate 121 and the adhesive layer 127 of FIG. 1B are replaced by a medium layer 123 which is made of a transparent material, and the transparent material has a refractive index in a range from about 1.2 to about 1.6. In addition, the positions of the MIM structure 115 and the optical filter 125 in the embodiment of FIG. 1C are not changed from the embodiment of FIG. 1B. In some embodiments, the medium layer 123 has a thickness $T7$ which is in a range from about 100 μm to about 400 μm. The thickness $T7$ of the medium layer 123 is greater than the thickness $T6$ of the optical filter 125, and the thickness $T6$ of the optical filter 125 is greater than the total thickness $T4$ of the MIM structure 115. Some components of the image sensor package 100*c* are similar to those of the image sensor package 100*b* shown in FIG. 1B and are not repeated herein for simplicity.

Referring to FIG. 1D, a partial cross section of an image sensor package 100*d* according to some embodiments is shown. In comparison with the image sensor package 100*b* of FIG. 1B, the positions of the MIM structure 115 and the optical filter 125 are exchanged in the image sensor package 100*d* of FIG. 1D. Specifically, the optical filter 125 is sandwiched between the high-k film 105 on the photoelectric conversion region 103 and the adhesive layer 127 under the cover plate 121. Moreover, the MIM structure 115 is disposed on the cover plate 121 of the medium layer 130*b*. Some components of the image sensor package 100*d* are similar to those of the image sensor package 100*b* shown in FIG. 1B and are not repeated herein for simplicity.

Figure 1F:
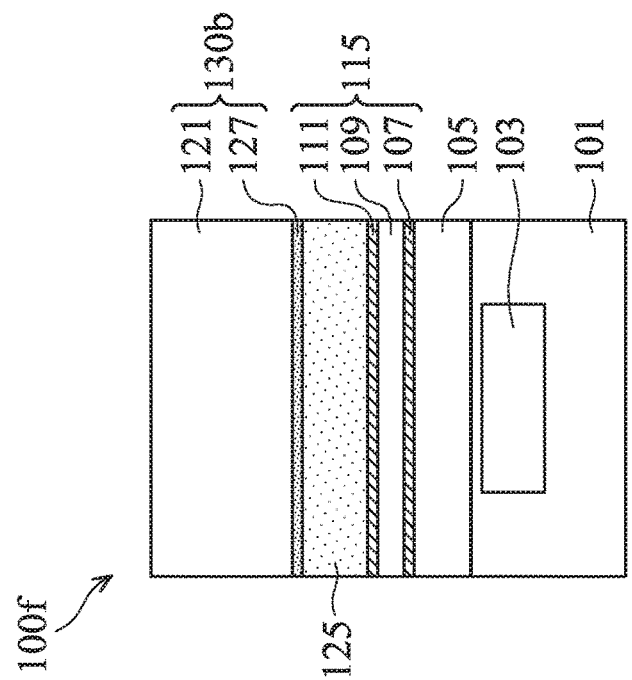
FIG. 1F shows a partial cross section of an image sensor package according to some embodiments.
Figure 1E:
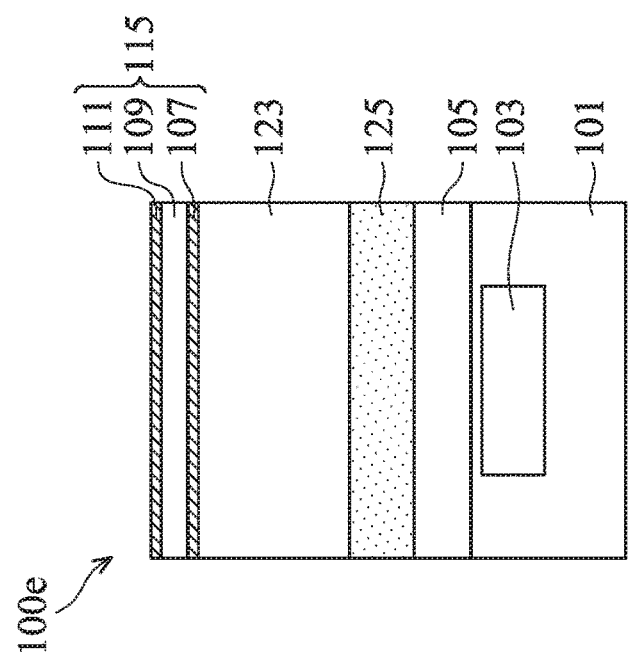
FIG. 1E shows a partial cross section of an image sensor package according to some embodiments.

Referring to FIG. 1E, a partial cross section of an image sensor package 100*e* according to some embodiments is shown. In comparison with the image sensor package 100*c* of FIG. 1C, the positions of the MIM structure 115 and the optical filter 125 are exchanged in the image sensor package 100*e* of FIG. 1E. Specifically, the optical filter 125 is sandwiched between the high-k film 105 on the photoelectric conversion region 103 and the medium layer 123. Moreover, the MIM structure 115 is disposed on the medium layer 123. Some components of the image sensor package 100*e* are similar to those of the image sensor package 100*c* shown in FIG. 1C and are not repeated herein for simplicity.

Referring to FIG. 1F, a partial cross section of an image sensor package 100*f* according to some embodiments is shown. In the embodiment of FIG. 1F, the medium layer 130*b* of the image sensor package 100*f* is disposed on the optical filter 125, and the MIM structure 115 is sandwiched between the high-k film 105 on the photoelectric conversion region 103 and the optical filter 125. Moreover, the cover plate 121 of the medium layer 130*b* is attached on the optical filter 125 by the adhesive layer 127. Some components of the image sensor package 100*f* are similar to those of the image sensor package 100*b* shown in FIG. 1B and are not repeated herein for simplicity.

Figure 2:
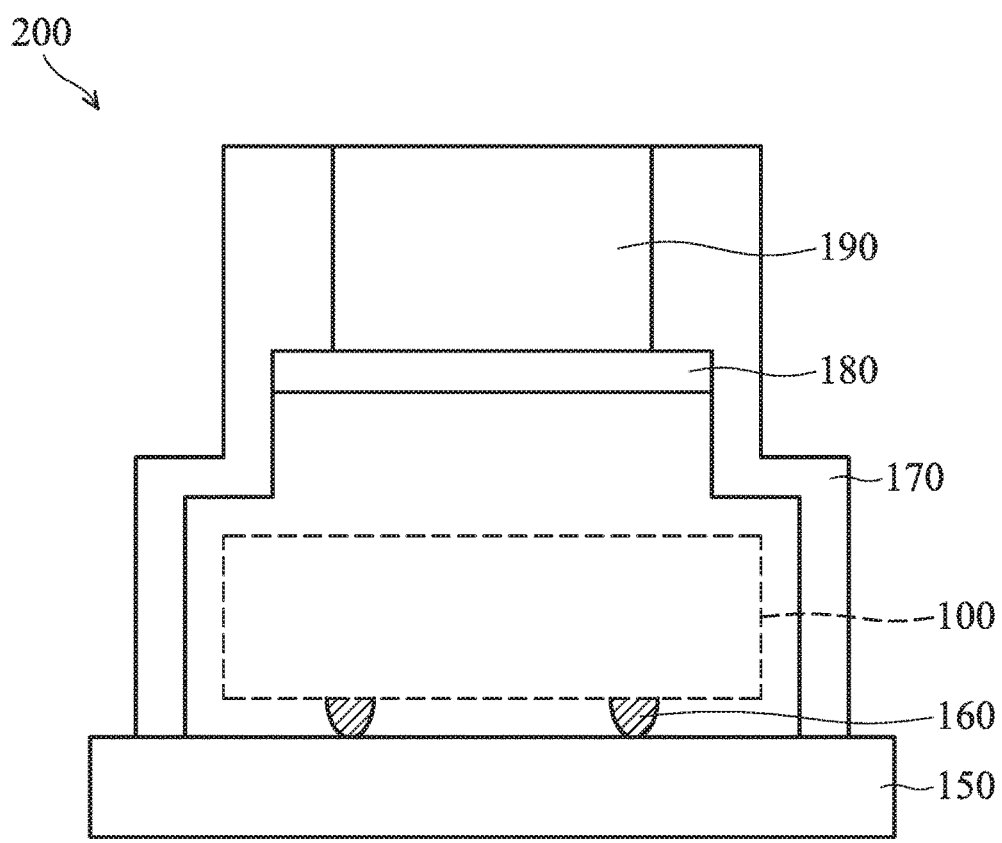
FIG. 2 shows a cross section of an image sensor module that includes an image sensor package of FIGS. 1A to 1F according to some embodiments.

Referring to FIG. 2, a cross section of an image sensor module 200 according to some embodiments is shown. In some embodiments, an image sensor package 100, which may be one of the image sensor packages 100*a*, 100*b*, 100*c*, 100*d*, 100*e*, 100*f*, is mounted on a circuit board 150 by a plurality of conducting structures 160, such as solder balls, bumps or conductive pillars. The image sensor package 100 is electrically connected to the circuit board 150 through the conducting structures 160.

As shown in FIG. 2, the image sensor module 200 further includes a holder 170, a filter 180 and a lens 190. The holder 170 has a capacity, so that the filter 180 and the lens 190 are disposed within the capacity of the holder 170 and are fixed to the holder 170. Therefore, the image sensor module 200 is a fixed-focus device. The capacity of the holder 170 can further accommodate the image sensor package 100 on the circuit board 150. The filter 180 in the capacity is located between the lens 190 and the image sensor package 100, and there is a gap between the filter 180 and the image sensor package 100. In some embodiments, the filter 180 is made of a light-transmissive material (such as glass) and a filter layer formed on the light-transmissive material. Specifically, the filter 180 may be the cover plate of FIG. 1A, and the holder 170 may be the spacer layer 117 of FIG. 1A. In some embodiments, the filter 180 is used to eliminate the image noise. Furthermore, the lens 190 can be formed by a single lens set or multiple lens sets. To simplify the diagram, only flat filter 180 and lens 190 are depicted herein. The structure of the image sensor module 200 is determined by design requirements and is not limited thereto. For example, in other embodiments, the image sensor module 200 can be a variable focus device.

Figure 3:
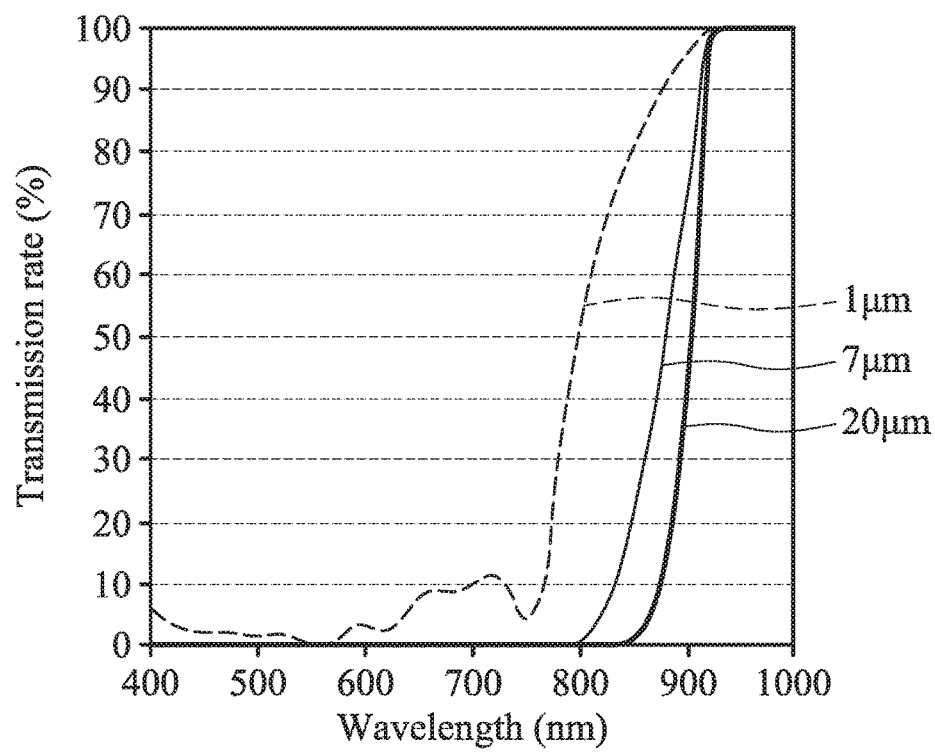
FIG. 3 is a diagram illustrating transmission characteristics of various optical filters with different thicknesses according to some embodiments.

Referring to FIG. 3, a diagram illustrating transmission characteristics of various optical filters 125 with different thicknesses according to some embodiments is shown. As mentioned previously, the optical filter 125 can decrease the transmission rate of the light that is not expected to be transmitted to the photoelectric conversion region 103 of the image sensor package 100. For example, for an image sensor package 100 which is intended to be an infrared (IR) image sensor package, the visible light, which covers the range of wavelengths from about 380 nm to about 750 nm, is expected to be filtered out before reaching the photoelectric conversion region 103 of the IR image sensor package. That is, the visible light cannot be transmitted to the photoelectric conversion region 103 of the IR image sensor package, and the transmission rate of the visible light should be close to 0. In the embodiments provided below, an IR image sensor package is used to exemplify the properties of the image sensor package 100 mentioned previously.

In the image sensor package 100 which is intended to be an IR image sensor package, an infrared-transmissive filter is used as the optical filter 125. The thicker the optical filter 125 (i.e. the infrared-transmissive filter) is, the lower transmission rate of the visible light it can reach. As shown in FIG. 3, the optical filters 125 (i.e. the infrared-transmissive filter) with thicknesses of 20 μm and 7 μm can completely filter out the visible light of the incident light, while there are still a little bit of visible light passing though the optical filter 125 with a thickness of 1 μm.

Figure 4A:
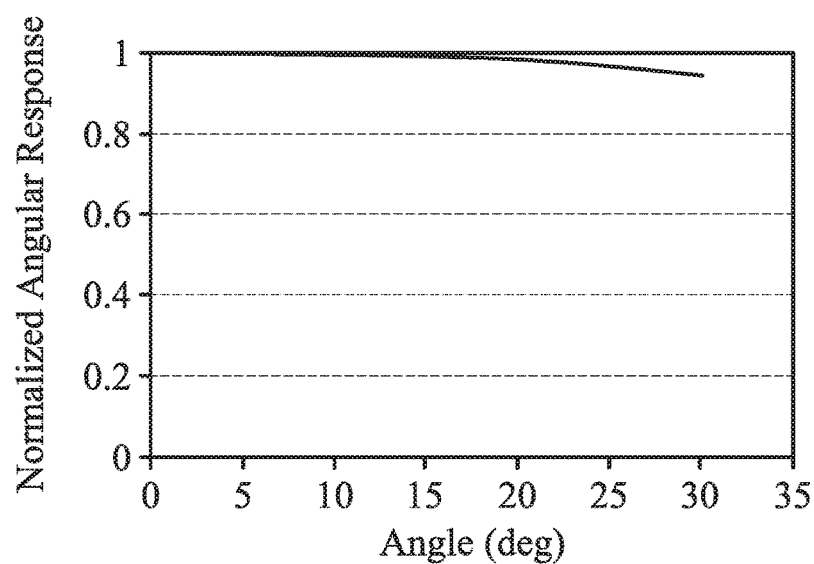
FIG. 4A is a diagram illustrating normalized angular response characteristics of a MIM structure according to some embodiments.

Referring to FIG. 4A, a diagram illustrating normalized angular response characteristics of the MIM structure 115 according to some embodiments is shown. As mentioned previously, the MIM structure 115 can decrease the decay of the angular response at large angles of incidence. As shown in FIG. 4A, for the incident light which have a 940 nm wavelength, the value of the normalized angular response remains at 1 when the angle of incidence is in a range from 0 degree to about 15 degrees and the value of the normalized angular response slightly drops to about 0.95 when the angles of the incidence increase to 30 degrees.

Figure 4B:
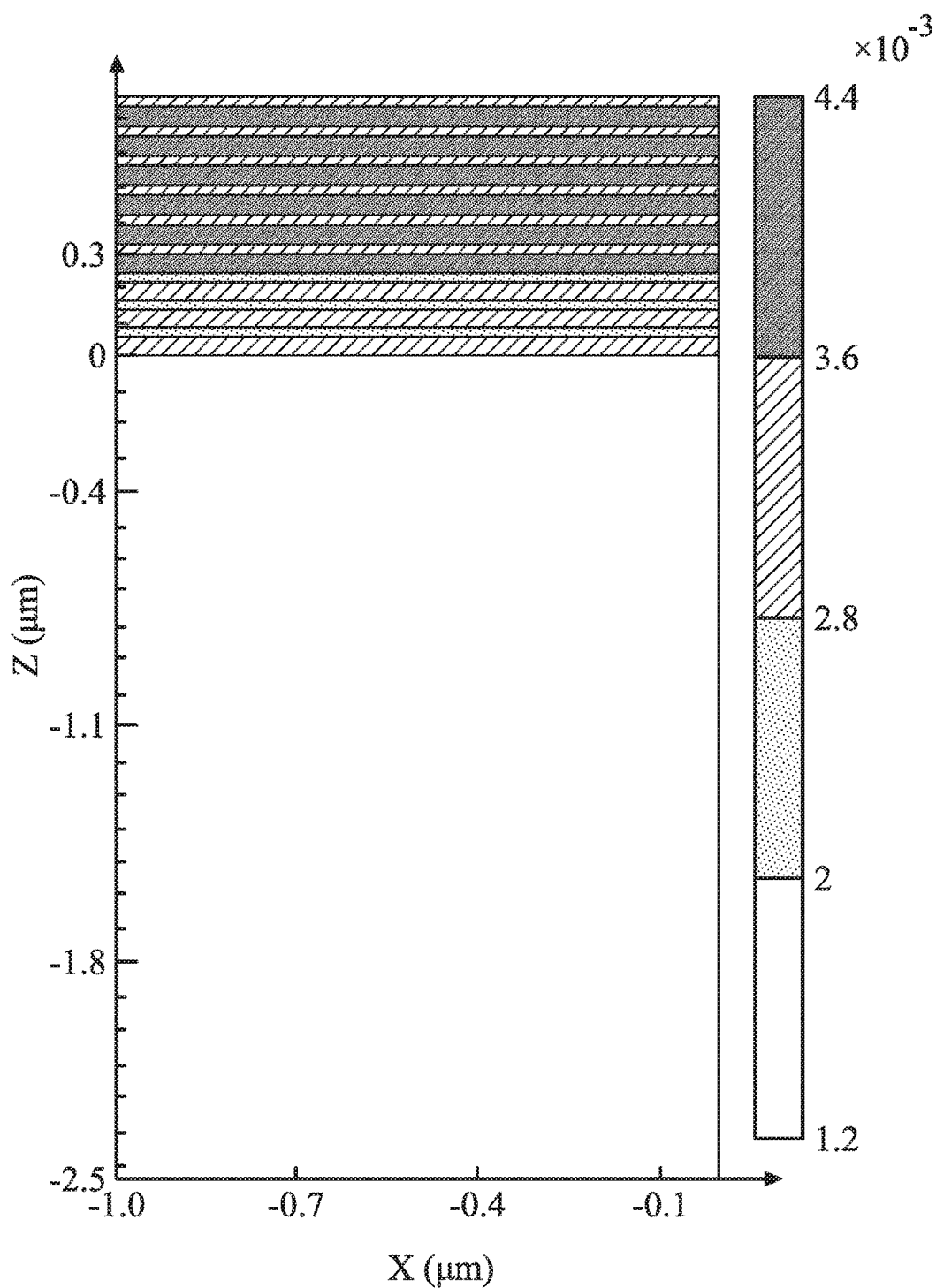
FIGS. 4B and 4C are simulated electric fields of a MIM structure in the X-Z plane of FIGS. 1A to 1F according to some embodiments.
Figure 4C:
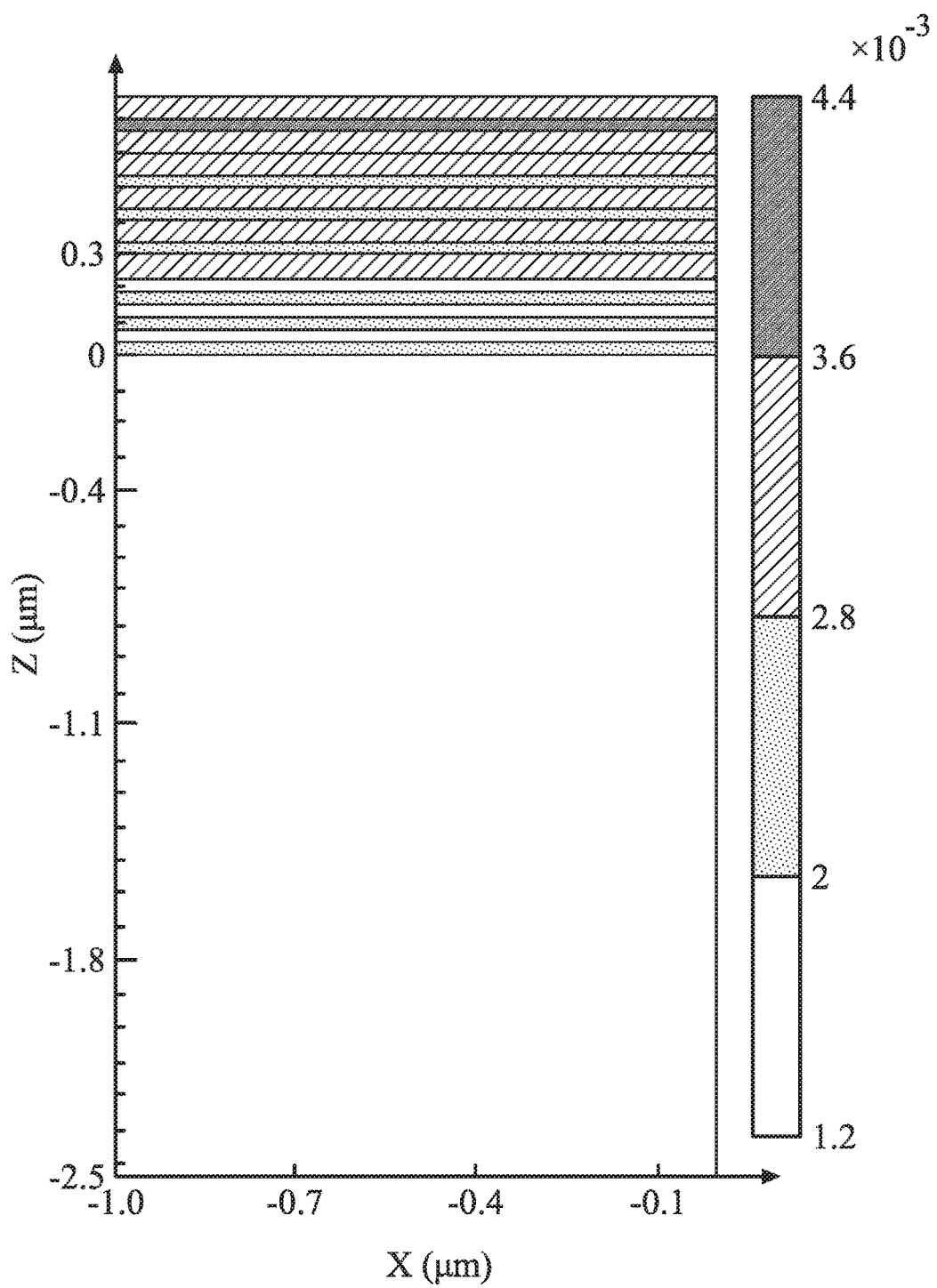

Referring to FIGS. 4B and 4C, simulated electric fields of the MIM structure 115 in the X-Z plane of FIGS. 1A to 1F according to some embodiments are shown. Specifically, FIG. 4B shows the electric field distribution of the MIM structure 115 when the angle of incidence is 0 degree, and FIG. 4C shows the electric field distribution of the MIM structure 115 when the angle of incidence is 30 degrees. The width of the photoelectric conversion region 103 is about 1 μm, which corresponds to the scale of the X-axis in FIGS. 4B and 4C. The location of the photoelectric conversion region 103 is at Z=0, and the direction of incident light is from Z>0 to Z=0. In addition, the bar shown on the right hand side represents the electric field intensity, and the electric field intensity is measured in units of volts squared per meter squared $(V/m)^2$.

As shown in FIGS. 4B and 4C, the electric fields of the incident light are evenly dispersed in the region between Z=0.7 and Z=0, which indicated that the incident light can successfully reach the photoelectric conversion region 103 of the image sensor package 100. In addition, in comparison with the electric field distribution of FIG. 4B, the electric field intensity of FIG. 4C is only slightly decreased when the angle of incidence comes to 30 degrees.

Figure 5:
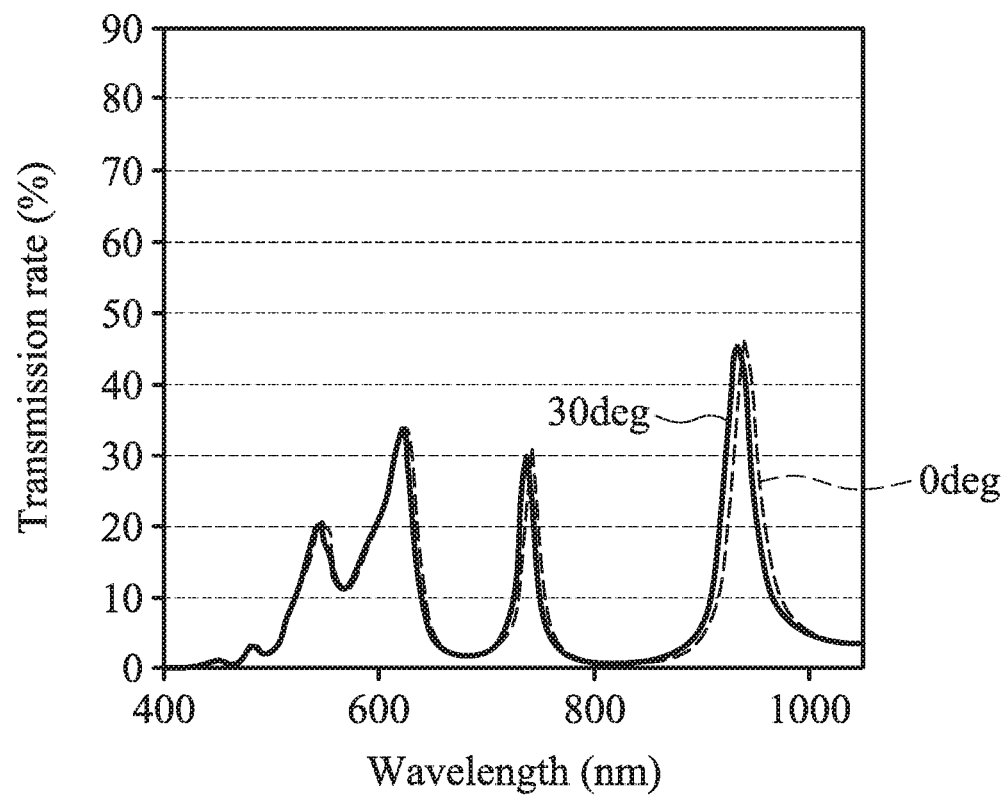
FIG. 5 is a diagram illustrating the transmission characteristics of a MIM structure according to some embodiments.

Referring to FIG. 5, a diagram illustrating transmission characteristics of the MIM structure 115 according to some embodiments is shown. As mentioned previously, the MIM structure 115 can narrow the full width at half maximum (FWHM) of the light transmitted to the photoelectric conversion region 103 and reduce the blue shift. As shown in FIG. 5, the band widths of the transmission rates of the incident light are narrow, and the MIM structure 115 exhibits a very small blue shift, which is only 7 nm.

Figure 6A:
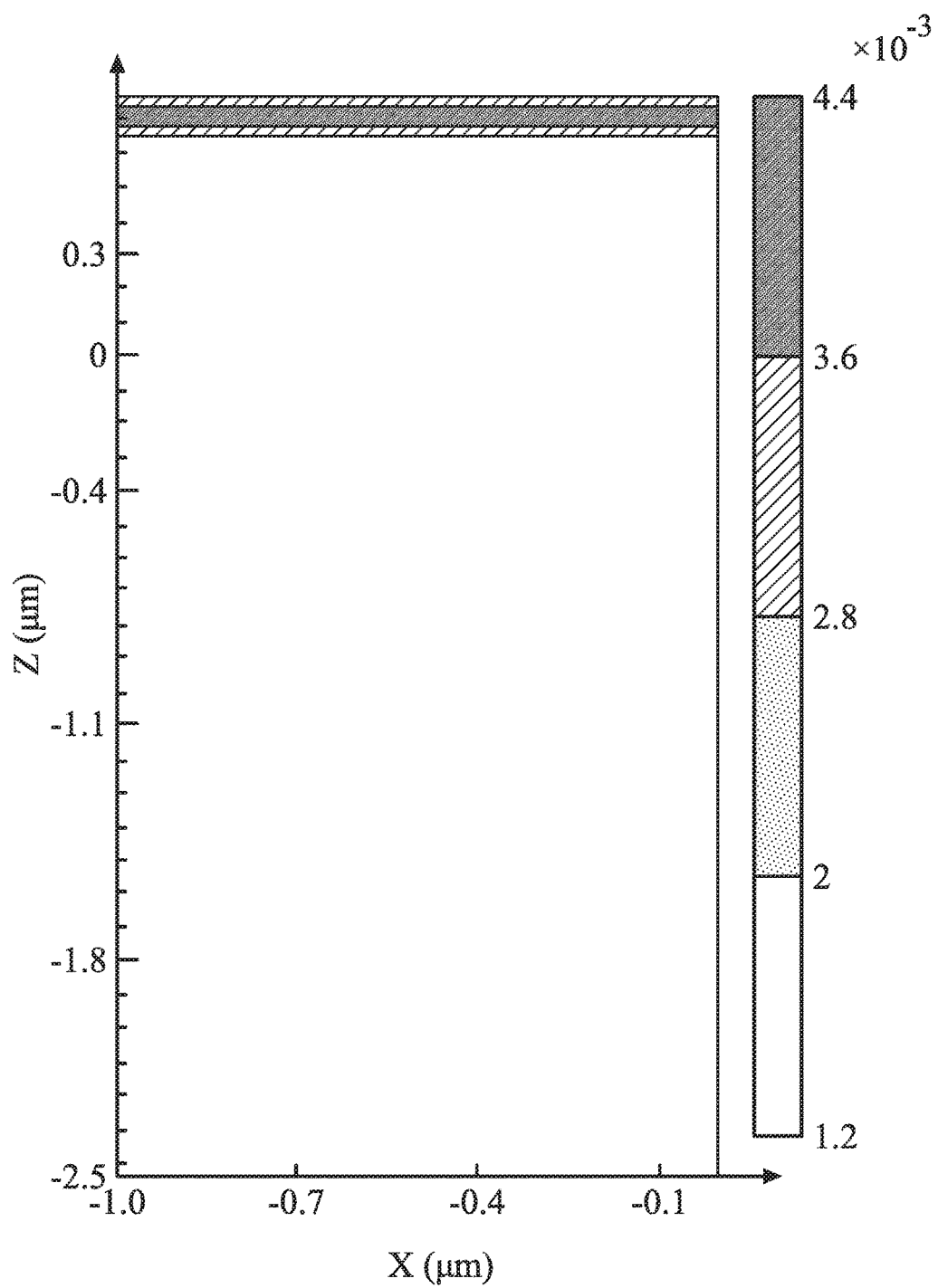
FIGS. 6A and 6B are simulated electric fields of an image sensor package in the X-Z plane of FIGS. 1A to 1F according to some embodiments.
Figure 6B:
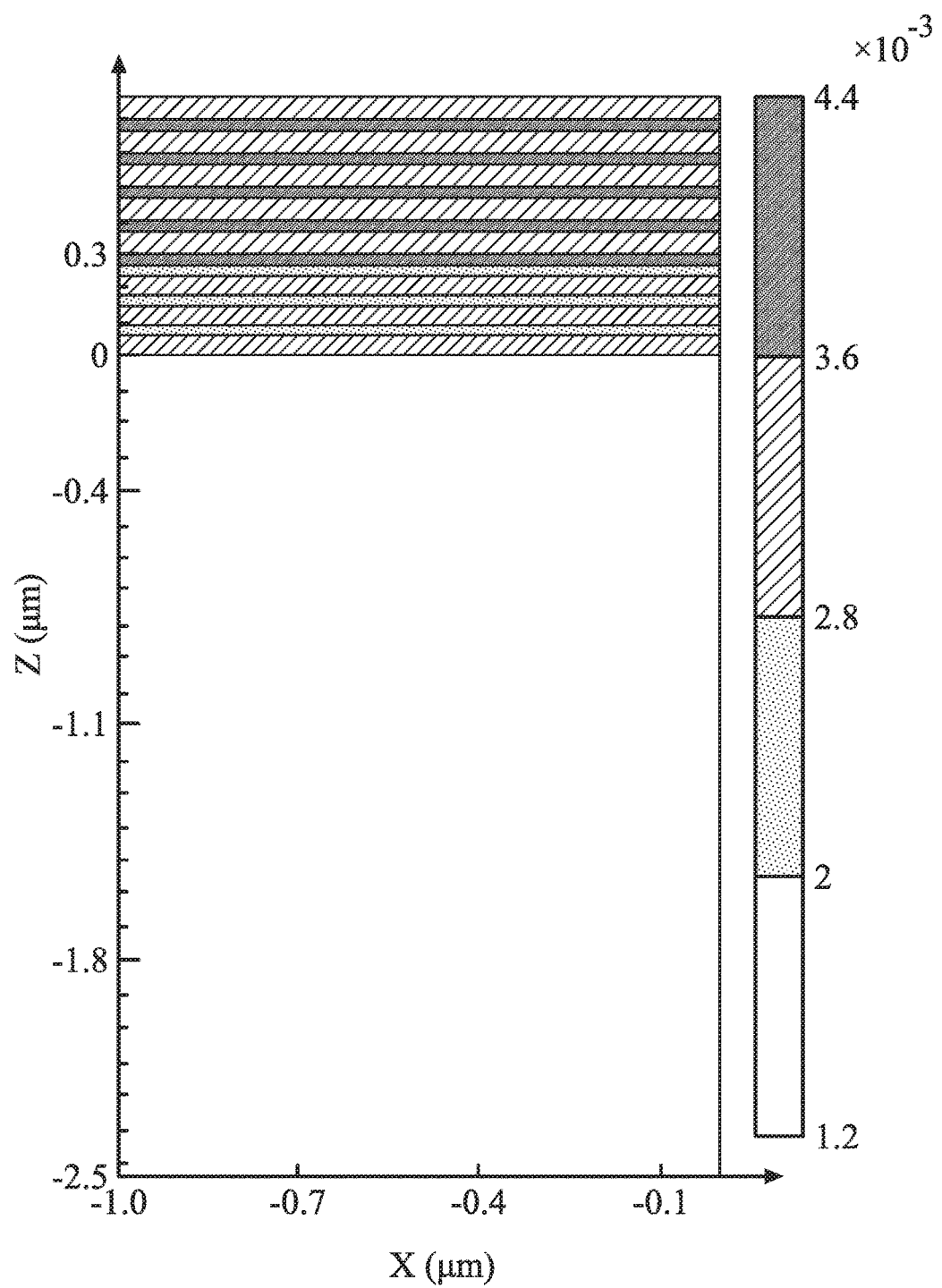

Referring to FIGS. 6A and 6B, simulated electric fields of an image sensor package 100 in the X-Z plane of FIGS. 1A to 1F according to some embodiments are shown. Specifically, FIG. 6A shows the electric field distribution of the image sensor package 100 when the wavelength of the incident light is 670 nm, and FIG. 6B shows the electric field distribution of the image sensor package 100 when the wavelength of the incident light is 940 nm. As mentioned earlier, the width of the photoelectric conversion region 103 is about 1 μm, which corresponds to the scale of the X-axis in FIGS. 6A and 6B. The location of the photoelectric conversion region 103 is at Z=0, and the direction of incident light is from Z>0 to Z=0. In addition, the bar shown on the right hand side represents the electric field intensity, and the electric field intensity is measured in units of volts squared per meter squared $(V/m)^2$.

As shown in FIG. 6A, the incident light with short wavelengths, such as 670 nm, is completely filtered out by the MIM structure 115 and the optical filter 125 of the image sensor package 100, which is intended to be an IR image sensor package. That is, the incident light with 670 nm wavelength is not transmitted to the photoelectric conversion region 103 (located at Z=0) of the image sensor package 100. Apart from this, the incident light with long wavelengths, such as 940 nm in the IR region, is successfully transmitted to the photoelectric conversion region 103 (located at Z=0) of the image sensor package 100 as shown in FIG. 6B.

Figure 7:
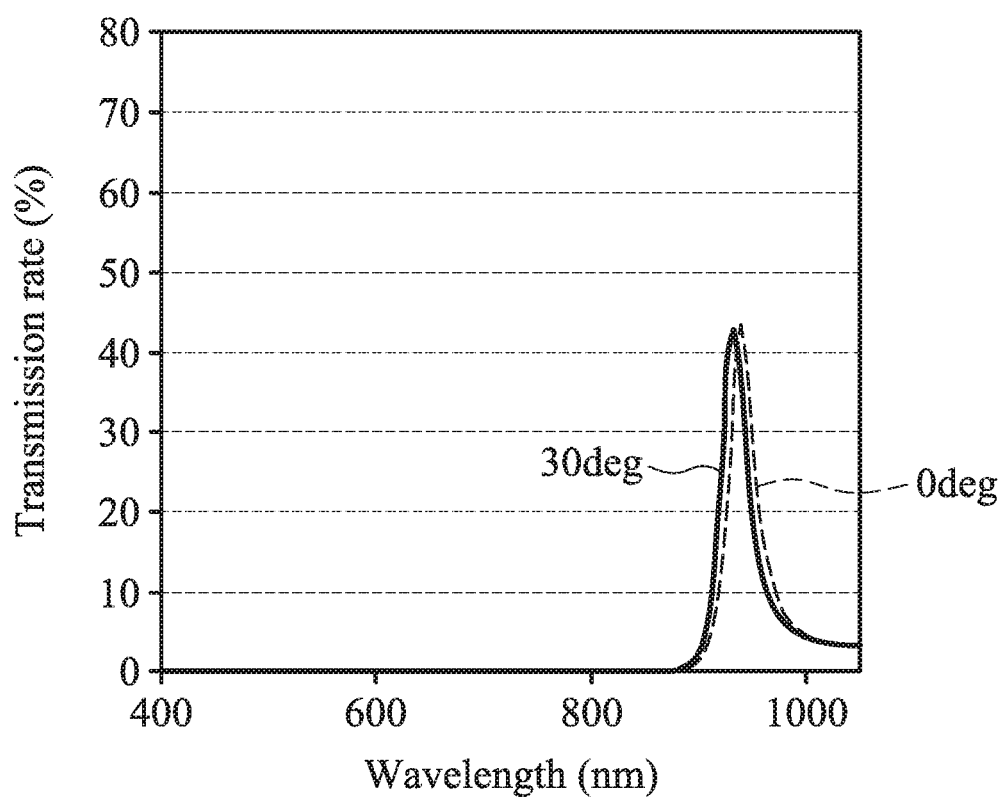
FIG. 7 is a diagram illustrating transmission characteristics of an image sensor package according to some embodiments.

Referring to FIG. 7, a diagram illustrating transmission characteristics of an image sensor package 100 according to some embodiments is shown. As mentioned previously, since the image sensor package 100 includes a MIM structure 115 and an optical filter 125, the transmission rate of the undesired light can be decreased (i.e. signal-to-noise (S/N) ratio can be increased), the full width at half maximum (FWHM) of the light expected to be transmitted to the photoelectric conversion region 103 can be decreased (i.e. the band width of the transmitted light can be narrower). As a result, the image sensor package 100 can produce a high signal-to-noise (S/N) ratio, which can be proved by FIG. 7. In addition, the influence of blue shift can be reduced or prevented. For example, as shown in FIG. 7, the image sensor package 100 exhibits a very small blue shift, which is only 7 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor package, comprising:
    a medium layer having a first surface and a second surface opposite to the first surface;
    a metal-insulator-metal structure disposed on the first surface of the medium layer, wherein the metal-insulator-metal structure comprises a first metal layer, a first insulating layer, and a second metal layer, and the first insulating layer is disposed between the first metal layer and the second metal layer; and
    an optical filter disposed on the second surface of the medium layer.

2. The image sensor package as claimed in claim 1, wherein the optical filter is an infrared-transmissive, red-light-transmissive, green-light-transmissive or blue-light-transmissive filter.

3. The image sensor package as claimed in claim 1, further comprising:
    a semiconductor substrate having a photoelectric conversion region,
    wherein the medium layer is disposed on the semiconductor substrate, and the metal-insulator-metal structure is disposed between the semiconductor substrate and the optical filter.

4. The image sensor package as claimed in claim 1, further comprising:
    a semiconductor substrate having a photoelectric conversion region, wherein the medium layer is disposed on the semiconductor substrate, and the optical filter is disposed between the semiconductor substrate and the metal-insulator-metal structure.

5. The image sensor package as claimed in claim 1, wherein the medium layer comprises a spacer layer, a cavity, and a transparent material, the transparent material is disposed between the spacer layer and the optical filter, and the cavity is enclosed by the spacer layer, the metal-insulator-metal structure and the transparent material.

6. The image sensor package as claimed in claim 1, wherein the medium layer comprises an adhesive layer and a transparent material, and the transparent material is disposed on the adhesive layer.

7. The image sensor package as claimed in claim 6, further comprising:
a semiconductor substrate having a photoelectric conversion region,
wherein the transparent material is disposed between the optical filter and the semiconductor substrate, and the adhesive layer is disposed on the metal-insulator-metal structure.

8. The image sensor package as claimed in claim 6, further comprising:
a semiconductor substrate having a photoelectric conversion region,
wherein the transparent material is disposed between the metal-insulator-metal structure and the semiconductor substrate, and the adhesive layer is disposed on the optical filter.

9. The image sensor package as claimed in claim 1, wherein the medium layer comprises a transparent material, and the transparent material has a refractive index in a range from 1.2 to 1.6.

10. The image sensor package as claimed in claim 9, wherein the medium layer is disposed on the metal-insulator-metal structure, and the metal-insulator-metal structure is disposed between the medium layer and the semiconductor substrate.

11. The image sensor package as claimed in claim 9, wherein the medium layer is disposed on the optical filter, and the optical filter is disposed between the medium layer and the semiconductor substrate.

12. The image sensor package as claimed in claim 1, wherein the optical filter has a thickness in a range from 1 µm to 20 µm.

13. The image sensor package as claimed in claim 1, wherein the thickness of the optical filter is in a range from 10 µm to 20 µm.

14. The image sensor package as claimed in claim 1, wherein the first metal layer and the second metal layer are made of silver, and the first insulating layer is made of amorphous silicon.

15. The image sensor package as claimed in claim 1, wherein the first metal layer has a first thickness, the second metal layer has a second thickness, the first insulating layer has a third thickness, and the third thickness is greater than the first thickness and the second thickness.

16. The image sensor package as claimed in claim 1, wherein the metal-insulator-metal structure further comprises a second insulating layer and a third insulating layer, and the first metal layer, the first insulating layer and the second metal layer are disposed between the second insulating layer and the third insulating layer.

17. The image sensor package as claimed in claim 1, further comprising:
a semiconductor substrate having a photoelectric conversion region; and
a high-k film disposed on the semiconductor substrate and covering the photoelectric conversion region, wherein the high-k film is disposed between the metal-insulator-metal structure and the semiconductor substrate.

18. The image sensor package as claimed in claim 17, wherein the optical filter is disposed between the metal-insulator-metal structure and the high-k film.

19. The image sensor package as claimed in claim 1, wherein the medium layer has a thickness which is greater than that of the metal-insulator-metal structure.

20. The image sensor package as claimed in claim 1, wherein the optical filter has a thickness which is greater than that of the metal-insulator-metal structure.

* * * * *